(12) United States Patent
Yamashita et al.

(10) Patent No.: US 8,779,544 B2
(45) Date of Patent: Jul. 15, 2014

(54) PHOTOELECTRIC CONVERSION APPARATUS AND IMAGING SYSTEM HAVING REVISION WITH MULTIPLE IMPURITY DENSITIES

(75) Inventors: Yuichiro Yamashita, Ebina (JP); Takanori Watanabe, Yamato (JP); Mineo Shimotsusa, Machida (JP); Takeshi Ichikawa, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 353 days.

(21) Appl. No.: 13/131,442

(22) PCT Filed: Jan. 26, 2010

(86) PCT No.: PCT/JP2010/051308
§ 371 (c)(1),
(2), (4) Date: May 26, 2011

(87) PCT Pub. No.: WO2010/090148
PCT Pub. Date: Aug. 12, 2010

(65) Prior Publication Data
US 2011/0234868 A1    Sep. 29, 2011

(30) Foreign Application Priority Data

Feb. 6, 2009   (JP) .................................. 2009-026700
Jan. 21, 2010  (JP) .................................. 2010-011375

(51) Int. Cl.
*H01L 21/00*   (2006.01)
*H01L 27/146*  (2006.01)
*H01L 31/062*  (2012.01)

(52) U.S. Cl.
CPC ....... *H01L 27/1464* (2013.01); *H01L 27/14654* (2013.01); *H01L 27/14656* (2013.01); *H01L 27/14672* (2013.01); *H01L 27/14674* (2013.01); *H01L 31/062* (2013.01)
USPC .................................. 257/447; 257/E27.128

(58) Field of Classification Search
CPC ..................... H01L 27/1464; H01L 27/14654; H01L 27/14656; H01L 27/14672; H01L 27/14674; H01L 31/062
USPC .......................................... 257/E27.128, 447
See application file for complete search history.

(56) References Cited

U.S. PATENT DOCUMENTS 6,281,531 B1   8/2001   Kamashita et al. ........... 257/258
6,423,993 B1   7/2002   Suzuki et al. .................. 257/292

(Continued)

FOREIGN PATENT DOCUMENTS

CN   1471311 A   1/2004
CN   1627524 A   6/2005

(Continued)

OTHER PUBLICATIONS

Chinese Office Action dated Jan. 14, 2013, issued in counterpart Chinese Application No. 201080006232.8, and English-language translation thereof.

(Continued)

*Primary Examiner* — Kimberly Rizkallah
*Assistant Examiner* — Alexander Belousov
(74) *Attorney, Agent, or Firm* — Fitzpatrick, Cella, Harper & Scinto

(57) ABSTRACT

A photoelectric conversion apparatus comprises multiple photoelectric conversion portions (51) disposed in a semiconductor substrate (5B) wherein each photoelectric conversion portion (51) includes: a P-type charge accumulating area (107) containing a first impurity; and an N-type well portion (102) that, along with the P-type charge accumulating area, configures a photodiode, and each well portion has: an N-type first semiconductor region (102*a*) containing arsenic at a first density; an N-type second semiconductor region (102*b*, 102C) disposed below the first semiconductor region and containing arsenic at a second density that is lower than the first density; and an N-type third semiconductor region (102*d*) disposed below the second semiconductor region and containing a second impurity at a third density that is higher than the first density.

6 Claims, 10 Drawing Sheets

(56) References Cited

U.S. PATENT DOCUMENTS

| | | |
|---|---|---|
| 6,731,337 B2 | 5/2004 | Watanabe |
| 6,885,047 B2 | 4/2005 | Shinohara et al. |
| 7,323,731 B2 | 1/2008 | Yuzurihara et al. ............ 257/292 |
| 7,411,170 B2 | 8/2008 | Shimotsusa et al. ....... 250/208.1 |
| 7,423,305 B2 | 9/2008 | Shinohara et al. |
| 7,456,880 B2 | 11/2008 | Okita et al. |
| 7,459,735 B2 * | 12/2008 | Ezaki et al. ................... 257/292 |
| 7,514,732 B2 | 4/2009 | Okita et al. |
| 7,687,299 B2 | 3/2010 | Ichikawa |
| 7,705,381 B2 | 4/2010 | Shinohara et al. |
| 7,723,766 B2 | 5/2010 | Shinohara et al. |
| 7,732,246 B2 | 6/2010 | Lee |
| 7,776,643 B2 | 8/2010 | Nomura et al. ................. 438/79 |
| 7,842,987 B2 | 11/2010 | Mabuchi |
| 7,920,192 B2 | 4/2011 | Watanabe et al. |
| 7,928,477 B2 | 4/2011 | Kobayashi et al. |
| 7,935,557 B2 | 5/2011 | Mishima et al. |
| 8,436,406 B2 | 5/2013 | Shinohara et al. |
| 8,541,255 B2 | 9/2013 | Mabuchi |
| 8,580,595 B2 | 11/2013 | Shinohara et al. |
| 2002/0050593 A1 | 5/2002 | Fukunaga et al. ............... 257/53 |
| 2004/0188722 A1 | 9/2004 | Izumi et al. ................... 257/215 |
| 2005/0035382 A1* | 2/2005 | Shinohara et al. ............ 257/290 |
| 2005/0269604 A1 | 12/2005 | Koizumi et al. ............. 257/291 |
| 2006/0043519 A1 | 3/2006 | Ezaki ............................ 257/461 |
| 2006/0138531 A1 | 6/2006 | Lee ............................... 257/327 |
| 2007/0281472 A1 | 12/2007 | Press et al. |
| 2008/0038865 A1 | 2/2008 | Kwon ............................. 438/73 |
| 2008/0296629 A1* | 12/2008 | Mabuchi ....................... 257/233 |
| 2009/0050997 A1 | 2/2009 | Mutoh |
| 2009/0256230 A1 | 10/2009 | Watanabe |
| 2009/0284632 A1 | 11/2009 | Onuki et al. |
| 2010/0187581 A1 | 7/2010 | Shinohara et al. |
| 2010/0203667 A1 | 8/2010 | Hirota et al. .................... 438/72 |
| 2010/0203670 A1 | 8/2010 | Ohtani et al. .................... 438/98 |
| 2010/0214464 A1 | 8/2010 | Watanabe |
| 2011/0032379 A1 | 2/2011 | Kobayashi et al. |
| 2011/0136291 A1 | 6/2011 | Iwata et al. |
| 2011/0157447 A1 | 6/2011 | Watanabe et al. |
| 2011/0171770 A1 | 7/2011 | Mishima et al. |
| 2011/0242387 A1 | 10/2011 | Watanabe |
| 2013/0264619 A1 | 10/2013 | Mabuchi |
| 2014/0008703 A1 | 1/2014 | Mabuchi |

FOREIGN PATENT DOCUMENTS

| | | |
|---|---|---|
| CN | 1758442 A | 4/2006 |
| CN | 1815744 A | 8/2006 |
| CN | 1819236 A | 8/2006 |
| CN | 101312205 A | 11/2008 |
| CN | 101359675 A | 2/2009 |
| EP | 1 542 286 A2 | 6/2005 |
| EP | 1 708 267 A1 | 10/2006 |
| EP | 1 995 783 A2 | 11/2008 |
| JP | 11-126893 A | 5/1999 |
| JP | 2001-257339 A | 9/2001 |
| JP | 2003-258223 A | 9/2003 |
| JP | 2004-193547 A | 7/2004 |
| JP | 2005-072236 A | 3/2005 |
| JP | 2005-136269 A | 5/2005 |
| JP | 2005-197674 A | 7/2005 |
| JP | 2006-024907 A | 1/2006 |
| JP | 2006-073609 A | 3/2006 |
| JP | 2008-060356 A | 3/2008 |
| JP | 2008-300446 A | 12/2008 |
| WO | WO 2005/109512 A1 | 11/2005 |

OTHER PUBLICATIONS

Dec. 24, 2012 Chinese Office Action in Application No. 201080006217.3.

* cited by examiner

F I G. 11
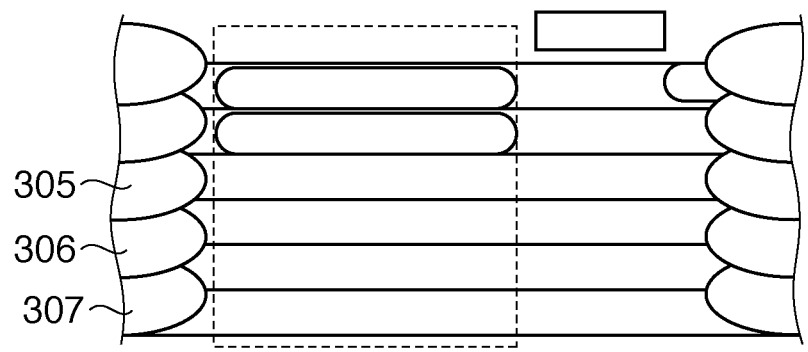

PHOTOELECTRIC CONVERSION APPARATUS AND IMAGING SYSTEM HAVING REVISION WITH MULTIPLE IMPURITY DENSITIES

TECHNICAL FIELD

The present invention relates to a photoelectric conversion apparatus and an imaging system.

BACKGROUND ART

Japanese Patent Laid-Open No. 2005-197674 (called "Patent Document 1" hereinafter) discloses a photoelectric conversion apparatus in which a P-type well to be disposed below an N-type charge accumulating area is described as being configured of multiple impurity areas 4A to 4D having differing depths, as shown in FIG. 1 of that document. The density of the impurity area 4A, which is the deepest of the multiple impurity areas 4A to 4D, is greater than the densities of the other impurity areas. Therefore, according to Patent Document 1, a potential barrier for electrons can be formed in the depth direction of the substrate, which makes it possible to guide the carrier to a photodiode in the depth direction efficiently and without loss, which in turn makes it possible to improve the sensitivity.

Incidentally, there is demand for pixel miniaturization and pixel sensitivity improvement in photoelectric conversion apparatuses. It is conceivable that miniaturizing the pixels in the photoelectric conversion apparatus disclosed in Patent Document 1 will also bring adjacent photodiodes closer to each other.

Patent Document 1 discloses forming the multiple impurity areas 4A to 4D by implanting boron, first in deep areas and moving sequentially to shallow areas, and then executing a heat treatment of 950° C. or less. When executing such heat treatment after forming the multiple impurity areas 4A to 4D, boron tends to diffuse even under heat treatments of 950° C. or less, and therefore the impurity density peaks in the respective impurity areas 4A to 4D drop easily. As a result, the slope of the potential along the substrate depth direction broadens, resulting in the possibility that the electrons will not reach the photodiodes of pixels in which electrons are produced and will instead reach adjacent pixels based on the mechanics of diffusion. In color sensors whose pixels have different spectral transmission characteristics from one another, this phenomenon results in a problem called "color mixture", whereby light of a certain color leaks into pixels that respond to a different color. In monochromatic sensors, this phenomenon appears as a drop in the MTF. This problem is apparent particularly when the distance between adjacent photodiodes (photoelectric conversion portions) is low.

DISCLOSURE OF INVENTION

It is an object of the present invention to efficiently collect holes, which make up a signal charge produced by a photoelectric conversion portion, in a charge accumulating area.

A photoelectric conversion apparatus according to a first aspect of the present invention includes multiple photoelectric conversion portions disposed in a semiconductor substrate. Each photoelectric conversion portion has a P-type charge accumulating area containing a first impurity and an N-type well portion that, along with the P-type charge accumulating area, configures a photodiode. Each well portion has an N-type first semiconductor region containing arsenic at a first density, an N-type second semiconductor region disposed below the first semiconductor region and containing arsenic at a second density that is lower than the first density, and an N-type third semiconductor region disposed below the second semiconductor region and containing a second impurity at a third density that is higher than the first density.

An imaging system according to a second aspect of the present invention includes: the photoelectric conversion apparatus according to the first aspect of the present invention; an optical system that forms an image upon an imaging area of the photoelectric conversion apparatus; and a signal processing unit that generates image data by processing a signal outputted from the photoelectric conversion apparatus.

According to the present invention, it is possible to efficiently collect holes, which make up a signal charge produced by a photoelectric conversion portion, in a charge accumulating area.

Further features of the present invention will become apparent from the following description of exemplary embodiments (with reference to the attached drawings).

BRIEF DESCRIPTION OF DRAWINGS

FIG. 11 is a diagram illustrating the cross-sectional structure of a photoelectric conversion apparatus according to a third embodiment of the present invention.

BEST MODE FOR CARRYING OUT THE INVENTION

In the present specification, disposing a second area "above" a first area includes cases where the second area is disposed upon another area that is itself disposed upon the first area, in addition to cases where the second area is disposed directly upon the first area. Similarly, disposing a second area "below" a first area includes cases where the second area is disposed below another area that is itself disposed below the first area, in addition to cases where the second area is disposed directly below the first area.

Figure 1:
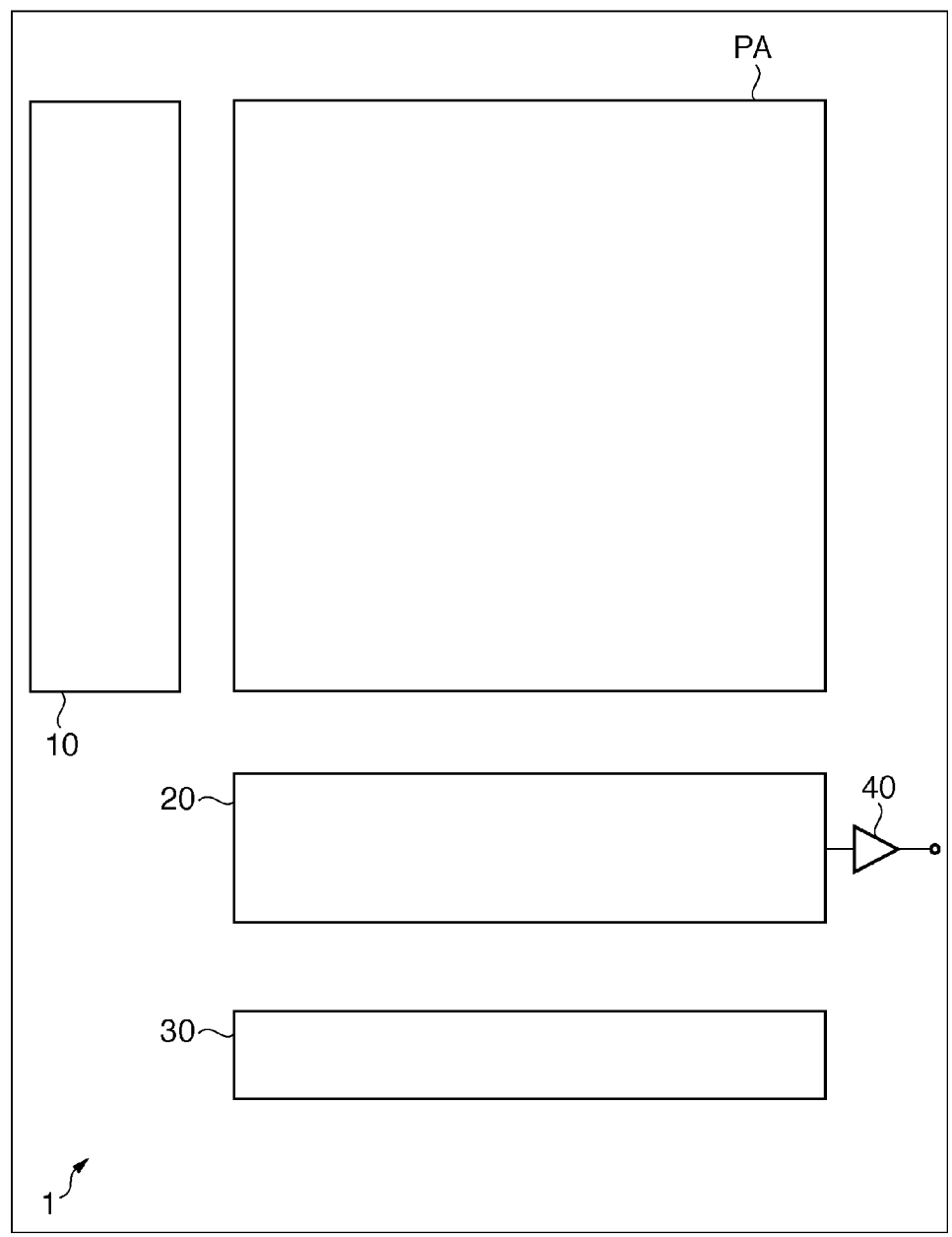
FIG. 1 is a diagram illustrating the overall configuration of a photoelectric conversion apparatus 1 according to an embodiment of the present invention.

The overall configuration of a photoelectric conversion apparatus 1 according to an embodiment of the present invention shall be described using FIG. 1. FIG. 1 is a diagram illustrating the overall configuration of the photoelectric conversion apparatus 1 according to an embodiment of the present invention.

The photoelectric conversion apparatus 1 includes a pixel array PA, a vertical scanning circuit 10, a holding circuit 20, a horizontal scanning circuit 30, and an output amplifier 40.

Figure 2:
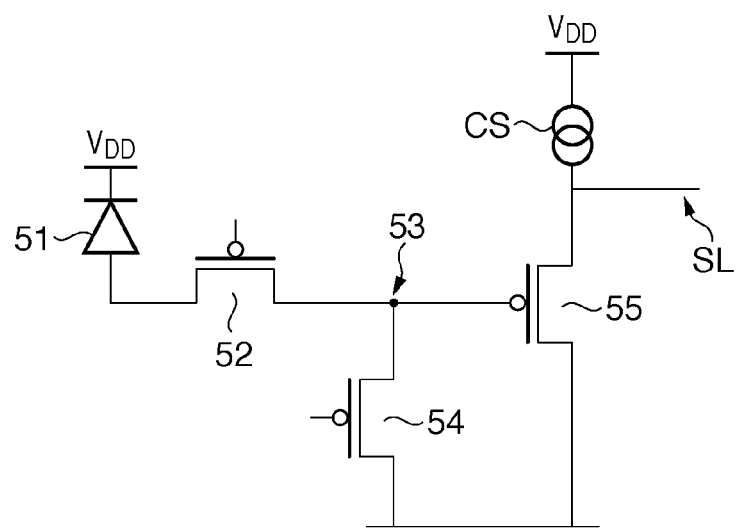
FIG. 2 is a diagram illustrating the configuration of a pixel P according to an embodiment of the present invention.

Multiple pixels P (see FIG. 2) are arranged one- or two-dimensionally in the pixel array PA. As shown in FIG. 2, each pixel P includes a photoelectric conversion portion 51, a transfer unit 52, a charge-voltage conversion unit 53, a reset unit 54, and an output unit 55. Note that FIG. 2 is a diagram illustrating the configuration of the pixel P according to an embodiment of the present invention.

The photoelectric conversion portion 51 produces a charge based on light and stores the charge. Here, the signal charge is holes. The photoelectric conversion portion 51 is, for example, a photodiode whose cathode is connected to a ground potential and whose anode is connected to the transfer unit 52.

The transfer unit 52 transfers the signal charge produced by the photoelectric conversion portion 51 to the charge-voltage conversion unit 53.

The transfer unit 52 is, for example, a PMOS transfer transistor, and transfers the signal charge produced by the photoelectric conversion portion 51 to the charge-voltage conversion unit 53 by turning on when an active-level transfer control signal is supplied from the vertical scanning circuit 10.

The charge-voltage conversion unit 53 converts the transferred charge into a voltage. The charge-voltage conversion unit 53 has, for example, a P-type floating diffusion.

The reset unit 54 resets the charge-voltage conversion unit 53 and places the pixel P in a selected/non-selected state based on a supplied reset potential. The reset unit 54 is, for example, a PMOS reset transistor, and resets the charge-voltage conversion unit 53 by turning on when an active-level reset control signal has been supplied from the vertical scanning circuit 10. The reset unit 54 places a pixel in a selected state by resetting the potential of the charge-voltage conversion unit 53 to a first reset potential in response to a supplied first reset potential (for example, L level). Meanwhile, the reset unit 54 places a pixel in a non-selected state by resetting the potential of the charge-voltage conversion unit 53 to a second reset potential in response to a supplied second reset potential (for example, H level).

The output unit 55 outputs a signal based on the voltage of the charge-voltage conversion unit 53 to a signal line SL. The output unit 55 is, for example, a PMOS amplifying transistor, and outputs a signal based on the voltage of the charge-voltage conversion unit 53 to the signal line SL by performing a source-follow operation with a constant current source CS connected to the signal line SL. In other words, the output unit 55 outputs a noise signal to the signal line SL based on the voltage of the charge-voltage conversion unit 53 in a state where the charge-voltage conversion unit 53 has been reset by the reset unit 54. The output unit 55 outputs, to the signal line SL, an optical signal based on the voltage of the charge-voltage conversion unit 53 in the state when the signal charge of the photoelectric conversion portion 51 was transferred to the charge-voltage conversion unit 53 by the transfer unit 52.

Note that each pixel P may be configured so as to include a selection unit (not shown). In this case, the selection unit switches the pixel P between the selected/non-selected states. The selection unit is, for example, a PMOS select transistor, and puts the pixel P in a selected state by turning on when an active-level selection control signal has been supplied from the vertical scanning circuit 10. The selection unit also puts the pixel P in a non-selected state by turning off when a non-active level selection control signal has been supplied from the vertical scanning circuit 10.

The vertical scanning circuit 10 selects a readout row in the pixel array PA from which signals are to be read out by scanning the pixel array PA in the vertical direction, and outputs the signals from the readout row to multiple signal lines SL.

The holding circuit 20 temporarily holds signals (noise signals, optical signals) of multiple columns outputted from the readout row via the multiple signal lines SL.

The horizontal scanning circuit 30 sequentially transfers, to the output amplifier 40, the signals (noise signals, optical signals) of the multiple columns held in the holding circuit 20 by scanning the holding circuit 20 in the horizontal direction.

The output amplifier 40 generates an image signal based on the transferred signals (noise signals, optical signals). For example, the output amplifier generates an image signal by finding the difference between a noise signal and an optical signal. The output amplifier 40 outputs the generated image signal to a later stage (an imaging signal processing circuit 95, described later).

Figure 3:
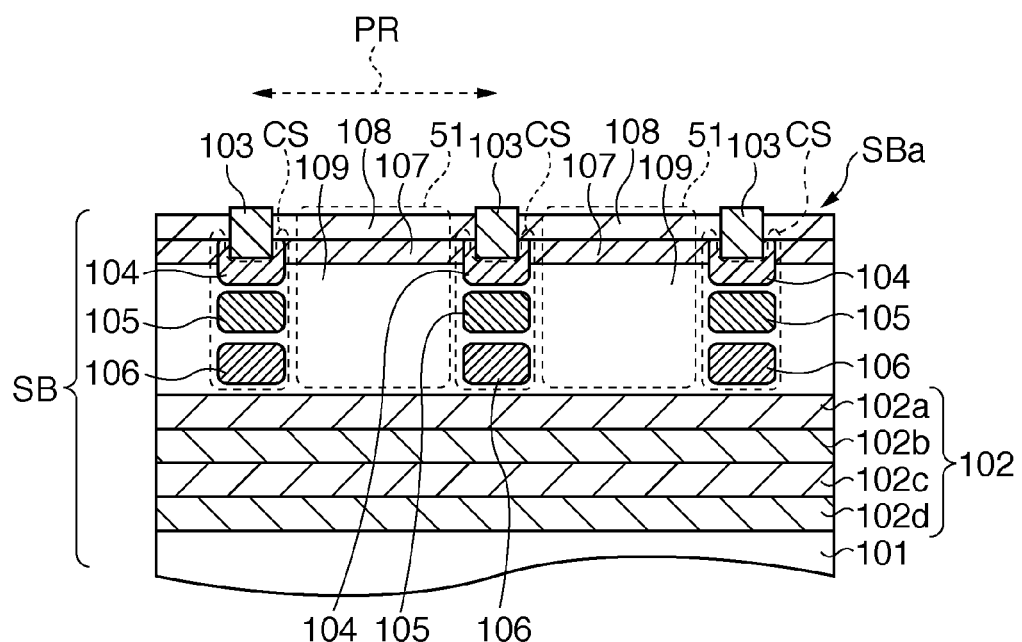
FIG. 3 is a diagram illustrating the cross-sectional structure of the photoelectric conversion apparatus 1 according to an embodiment of the present invention.

Next, the cross-sectional structure of the photoelectric conversion apparatus 1 according to an embodiment of the present invention shall be described using FIG. 3. FIG. 3 is a diagram illustrating the cross-sectional structure of the photoelectric conversion apparatus 1 according to an embodiment of the present invention. A pixel region PR, corresponding to a single pixel, is shown in FIG. 3.

The photoelectric conversion apparatus 1 includes multiple photoelectric conversion portions 51, multiple device isolation areas 103, a well portion 102, and multiple channel stop portions CS.

The multiple photoelectric conversion portions 51 are disposed in a semiconductor substrate SB. The semiconductor substrate SB is formed primarily of, for example, silicon. Although not depicted in FIG. 3, the multiple photoelectric conversion portions 51 are disposed in what is a one-dimensional or two-dimensional array when viewed from above. A ground region 101 is disposed in the semiconductor substrate SB extending across all pixel regions PR in the location furthest from a surface SBa. The ground region 101 is a region of the semiconductor substrate SB that has not been implanted with impurities. The ground region 101 contains a P-type impurity.

The photoelectric conversion portion 51 produces a charge pair based on light and accumulates holes, which are signal charges. Each photoelectric conversion portion 51 is, for example, a photodiode. The photoelectric conversion portion 51 includes a charge accumulating area 107, a surface region 108, and an effective sensitivity region (charge collecting area) 109. The effective sensitivity region (charge collecting area) is provided as necessary.

The charge accumulating area 107 is disposed below the surface region 108. The charge accumulating area 107 contains a P-type first impurity at a higher density than that of the ground region 101. The first impurity is, for example, boron. The charge accumulating area 107 is formed through, for example, boron ion implantation. The charge accumulating area 107 accumulates holes.

The surface region 108 contains an N-type impurity at a higher density than the density of the first impurity in the charge accumulating area 107. The surface region 108 contains the N-type impurity at a sixth density. The sixth density is a density that is higher than a fourth density (the density of an N-type impurity in a semiconductor region 104), which shall be mentioned later. The surface region 108 is formed through, for example, arsenic ion implantation. A photodiode becomes a buried photodiode due to the surface region 108, and therefore the generation of dark current caused by a dangling bond at the surface SBa of the semiconductor substrate SB can be suppressed.

The effective sensitivity region 109 is disposed below the charge accumulating area 107. The effective sensitivity region 109 contains a P-type impurity at a lower density than that of the charge accumulating area 107. While it is possible to form the effective sensitivity region 109 through boron ion implantation, it is also possible to use a region of the semiconductor substrate SB in which impurities have not been implanted as the effective sensitivity region 109. The effective sensitivity region 109 collects the charge (for example, a positive charge from holes) produced by photoelectric conversion and guides the charge to the charge accumulating area 107.

The multiple device isolation areas 103 are disposed between the multiple photoelectric conversion portions 51 in the semiconductor substrate SB so as to isolate the photoelectric conversion portions 51 from one another. "Isolation" as used here refers to electrically isolating at least the charge accumulating areas 107 from each other. It is, however, further preferable for the effective sensitivity regions 109 to be electrically isolated from each other as well. As opposed to this, the surface regions 108 and buried regions 102 need not be isolated. Although not shown here, the multiple device isolation areas 103 extend between the multiple photoelectric conversion portions 51 in strip form or grid form so as to isolate the multiple photoelectric conversion portions 51 from one another.

Each device isolation area 103 is disposed above a channel stop portion CS. The channel stop portion CS is configured so as to include a channel stop region 104 disposed at the border of a device isolation region and configured of an insulator, and semiconductor regions 105 and 106 that function as potential barriers. Each device isolation area 103 is disposed laterally to the surface region 108 in the photoelectric conversion portion 51. Each device isolation portion 103 is formed of an insulator such as silicon oxide. The device isolation portion 103 may have, for example, an STI (Shallow Trench Isolation) structure, or may have a LOCOS (LOCal Oxidation of Silicon) structure. Alternatively, diffusive isolation may be employed.

The well portion 102 configures the photodiode along with the charge accumulating area 107. Although the well portion 102 is illustrated in FIG. 3 as being disposed in a location deep within the substrate under the effective sensitivity region, the effective sensitivity region may be omitted and the well portion 102 provided directly below the charge accumulating area 107. The well portion 102 is disposed above the ground region 101. Although not illustrated in FIG. 3, the well portion 102 may be disposed across all pixel regions PR beneath the multiple photoelectric conversion portions 51 and the multiple device isolation areas 103, or in other words, disposed extending across the entirety of the pixel array PA (see FIG. 1).

The well portion 102 contains multiple semiconductor regions at differing depths from the surface SBa of the semiconductor substrate SB. In other words, the well portion 102 contains a semiconductor region (first semiconductor region) 102a, a semiconductor region (second semiconductor region) 102b, a semiconductor region (second semiconductor region) 102c, and a semiconductor region (third semiconductor region) 102d.

The semiconductor region 102a is disposed in the shallowest location of the well portion 102. The semiconductor region 102a is disposed below the charge accumulating area 107, with the effective sensitivity region 109 located therebetween. However, the effective sensitivity region 109 need not be provided. The semiconductor region 102a contains an N-type second impurity at a first density (see the density profile PF2a illustrated in FIG. 7C). The second impurity uses, for example, arsenic as its primary component. The first density is a density that is higher than the density of the P-type impurity in the ground region 101.

The semiconductor region 102b is disposed between the semiconductor region 102a and the semiconductor region 102d in the direction that is perpendicular to the surface of the semiconductor substrate SB. The semiconductor region 102b is disposed below the semiconductor region 102a. The semiconductor region 102b contains the N-type second impurity at a second density. The second density is a density that is lower than the first density (see the density profile PF2b illustrated in FIG. 7C). Note that a P-type region that is completely depleted due to built-in potential and that is of a thickness that does not cause operational problems may be left between the semiconductor region 102a and the semiconductor region 102b.

The semiconductor region 102c is disposed between the semiconductor region 102a and the semiconductor region 102d in the direction that is perpendicular to the surface of the semiconductor substrate SB. The semiconductor region 102c is disposed below the semiconductor region 102b. The semiconductor region 102c contains the N-type second impurity at the second density. The second density is a density that is lower than the first density (see the density profile PF2c illustrated in FIG. 7C). Note that a P-type region that is completely depleted due to built-in potential and that is of a thickness that does not cause operational problems may be left between the semiconductor region 102b and the semiconductor region 102c.

The semiconductor region 102d is disposed in the deepest location of the well portion 102. The semiconductor region 102d is disposed below the semiconductor region 102c. The semiconductor region 102d contains the N-type second impurity at a third density. The third density is a density that is higher than the first density (see the density profile PF2d illustrated in FIG. 7C). Note that a P-type region that is completely depleted due to built-in potential and that is of a thickness that does not cause operational problems may be left between the semiconductor region 102c and the semiconductor region 102d.

The multiple channel stop portions CS suppress the formation of channels at the borders of device isolation regions caused by insulators. Furthermore, each channel stop portion CS is disposed below a corresponding device isolation area 103 in the direction perpendicular to the surface of the semiconductor substrate SB, so as to isolate the multiple photoelectric conversion portions 51 from one another. Although not shown here, the multiple channel stop portions CS extend between the multiple photoelectric conversion portions 51 in strip form or grid form so as to isolate the multiple photoelectric conversion portions 51 from one another.

Each channel stop portion CS contains a semiconductor region (fourth semiconductor region) 104, as well as a semiconductor region (fifth semiconductor region) 105 and a semiconductor region (fifth semiconductor region) 106 disposed between photoelectric conversion portions and functioning as potential barriers for holes.

The semiconductor region 104 covers at least the base surface of the device isolation area 103, and furthermore extends to the surface region 108. The semiconductor region 104 is disposed below the device isolation area 103 so as to cover the base of the device isolation area 103. The semiconductor region 104 is disposed in a position deeper than the surface SBa of the semiconductor substrate SB and extended lateral to the charge accumulating area 107. The semiconductor region 104 contains the N-type second impurity at a fourth density. The second impurity uses, for example, arsenic, which is an N-type impurity, as its primary component. The fourth density is a density that is higher than the second density (see the density profile PF2b illustrated in FIG. 7C). The fourth density may be equal to the first density (see the density profile PF2a illustrated in FIG. 7C). The semiconductor region 104 is formed by, for example, arsenic ion implantation.

The semiconductor region 105 is disposed below the semiconductor region 104. The semiconductor region 105 is also disposed lateral to the effective sensitivity region 109. The semiconductor region 105 contains the second impurity at a fifth density. The fifth density is a density that is higher than the second density (see the density profile PF2b illustrated in FIG. 7C). The fifth density may be equal to the first density (see the density profile PF2a illustrated in FIG. 7C). The second impurity uses, for example, arsenic, which is an N-type impurity, as its primary component. The semiconductor region 105 is formed by, for example, arsenic ion implantation.

The semiconductor region 106 is disposed below the semiconductor region 105. The semiconductor region 106 is also disposed lateral to the effective sensitivity region 109. The semiconductor region 105 contains the second impurity at the fifth density. The fifth density is a density that is higher than the second density (see the density profile PF2b illustrated in FIG. 7C). The fifth density may be equal to the first density (see the density profile PF2a illustrated in FIG. 7C). The second impurity uses, for example, arsenic, which is an N-type impurity, as its primary component. The semiconductor region 105 is formed by, for example, arsenic ion implantation.

Here, the mass of the second impurity (for example, arsenic) contained in the semiconductor regions 102a to 102d in the well portion 102 is greater than the mass of the P-type impurity (for example, boron). Based on this, the diffusion coefficient of the second impurity is lower than the diffusion coefficient of the P-type impurity. Accordingly, even if the well portion is formed by executing heat treatment following impurity implantation, the impurity density peaks in the semiconductor regions 102a to 102d do not easily drop. Therefore, a higher potential barrier (see the potential levels PH2a and PH2d illustrated in FIG. 7C) can be maintained for holes, which are the signal charge, than in the case where the well portion is formed of multiple semiconductor regions that contain P-type impurities and are located at different depths. The semiconductor region 102d disposed in the deepest position has the highest impurity density, whereas the semiconductor region 102a disposed closest to the surface has the next-highest impurity density; the semiconductor regions 102b and 102c have the lowest impurity densities. The semiconductor regions 102b and 102c may be configured as a single region. Employing such an impurity density relationship makes it possible to maintain the electrical field in the vertical direction and efficiently guide the holes, which make up the signal charge produced by the photoelectric conversion portion, to the charge accumulating area. It is further possible to suppress the expansion of a depleted layer from the charge accumulating area 107, thereby making it possible to reduce the driving voltage when reading out signals.

As shall be described later, forming the semiconductor regions 102a and 102b from arsenic makes it possible to suppress distribution changes in the N well that spreads across the entire pixel, thereby making it possible to further enhance the aforementioned effects. Furthermore, it is difficult for holes to pass through the multiple semiconductor regions 102a to 102d and reach adjacent photoelectric conversion portions. Therefore, color mixture, which occurs when the distance between adjacent photoelectric conversion portions drops, can be suppressed.

Next, a manufacturing method for a photoelectric conversion apparatus according to an embodiment of the present invention shall be described using FIGS. 4A to 6B. FIGS. 4A through 6B are cross-sections illustrating steps of a photoelectric conversion apparatus manufacturing method according to an embodiment of the present invention.

Figure 4A:
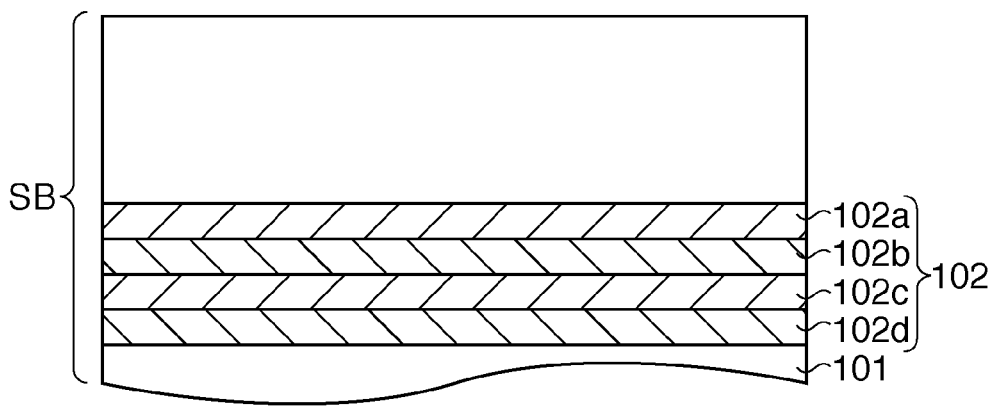
FIGS. 4A through 4C are cross-sections illustrating steps of a photoelectric conversion apparatus manufacturing method according to an embodiment of the present invention.

In the step illustrated in FIG. 4A, a resist is applied to the semiconductor substrate SB and then patterned through an exposure process, thereby forming a first resist pattern (not shown) that exposes the pixel array PA (see FIG. 1). The semiconductor region 102d is then formed by implanting the semiconductor substrate SB with the N-type second impurity, using the first resist pattern as a mask. The second impurity uses, for example, arsenic as its primary component. At this time, for example, the dose of the second impurity is $5\times10^{13}/cm^2$, and the acceleration energy of the implantation is 4000 KeV.

The semiconductor region 102c is then formed by implanting the semiconductor substrate SB with the N-type second impurity, using the first resist pattern as a mask. The second impurity uses, for example, arsenic as its primary component. At this time, for example, the dose of the second impurity is $5\times10^{11}/cm^2$, and the acceleration energy of the implantation is 2500 KeV.

The semiconductor region 102b is then formed by implanting the semiconductor substrate SB with the N-type second impurity, using the first resist pattern as a mask. The second impurity uses, for example, arsenic as its primary component. At this time, for example, the dose of the second impurity is $5\times10^{11}/cm^2$, and the acceleration energy of the implantation is 1200 KeV.

The semiconductor region 102a is then formed by implanting the semiconductor substrate SB with the N-type second impurity, using the first resist pattern as a mask. The second impurity uses, for example, arsenic as its primary component. At this time, it is preferable for, for example, the dose of the second impurity to be $10^{12}/cm^2$, and the acceleration energy of the implantation to be 600 KeV.

Figure 4B:
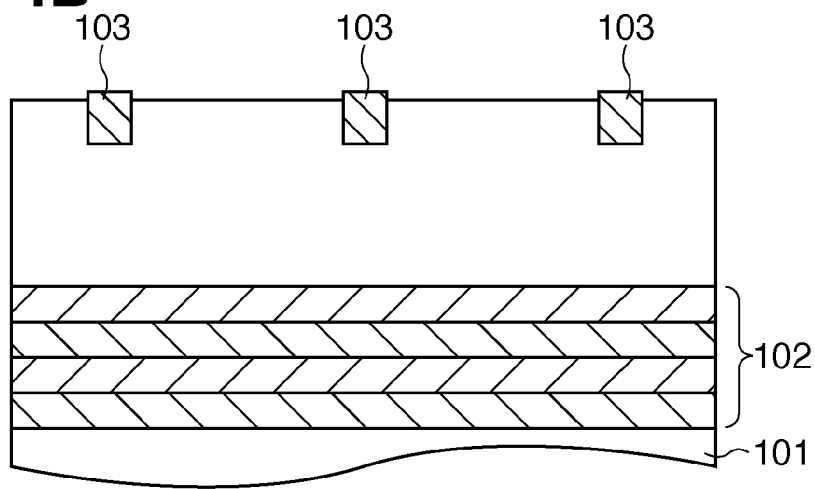

In the step illustrated in FIG. 4B, an STI device isolation area 103 is formed by first forming channels in regions in which the multiple photoelectric conversion portions in the semiconductor substrate SB are to be isolated from one another, and then burying an insulator in those channels.

Figure 4C:
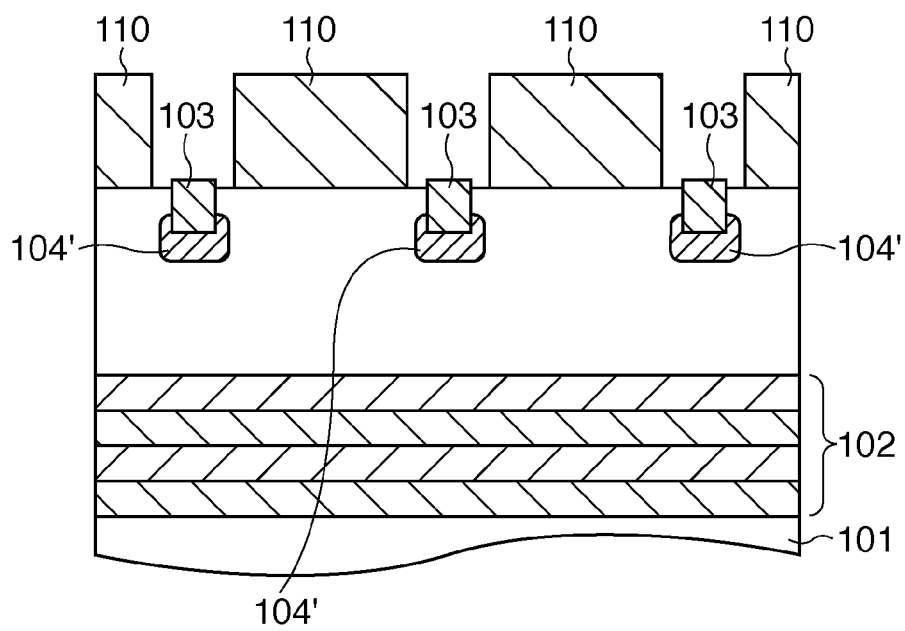

In the step illustrated in FIG. 4C, a resist is applied to the semiconductor substrate SB and then patterned through an exposure process, thereby forming a second resist pattern 110 that exposes the device isolation areas. Semiconductor regions 104' are then formed in the semiconductor substrate SB below the device isolation areas 103 by implanting the N-type second impurity in the semiconductor substrate SB using the second resist pattern 110 as a mask. The N-type second impurity in this step is, for example, arsenic, which is an N-type impurity. It is preferable for the acceleration energy of the implantation in the step to be approximately 300 keV to 2 MeV, and further preferable for the acceleration energy to be approximately 500 keV to 900 keV.

Figure 5A:
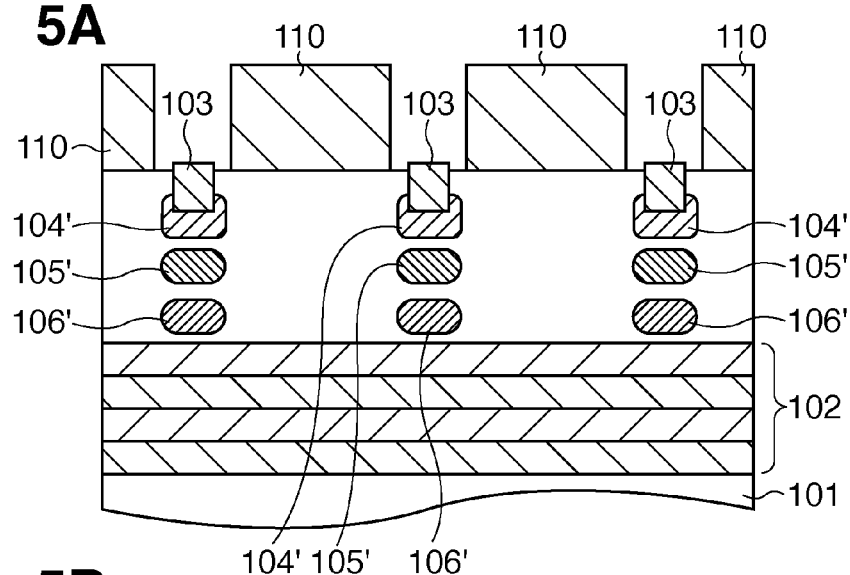
FIGS. 5A through 5C are cross-sections illustrating steps of a photoelectric conversion apparatus manufacturing method according to an embodiment of the present invention.

In the step illustrated in FIG. 5A, semiconductor regions 105' are formed in the semiconductor substrate SB below the semiconductor regions 104' by implanting the semiconductor substrate SB with the N-type second impurity, using the second resist pattern 110 as a mask. In addition, semiconductor regions 106' are formed in the semiconductor substrate SB below the semiconductor regions 105' by implanting the semiconductor substrate SB with the N-type second impurity, using the second resist pattern 110 as a mask. The N-type second impurity in this step is, for example, arsenic, which is an N-type impurity. It is preferable for the acceleration energy of the implantation in the step to be approximately 300 keV to 2 MeV, and further preferable for the acceleration energy to be approximately 500 keV to 900 keV.

Here, the aforementioned conditions can be used as the conditions for each instance of implantation. Furthermore, in the present embodiment, the semiconductor region 104', the semiconductor region 105', and the semiconductor region 106' can be formed using the same resist pattern. This enables low-cost manufacture without an increase in the number of processing steps. It also makes it possible to suppress variance in the properties arising in the manufacture due to misalignments.

Figure 5B:
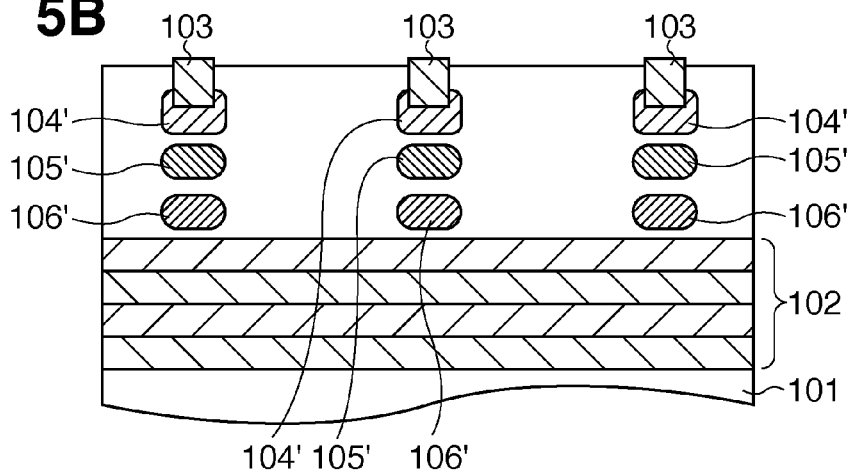

In the step illustrated in FIG. 5B, the second resist pattern 110 is removed.

Figure 5C:
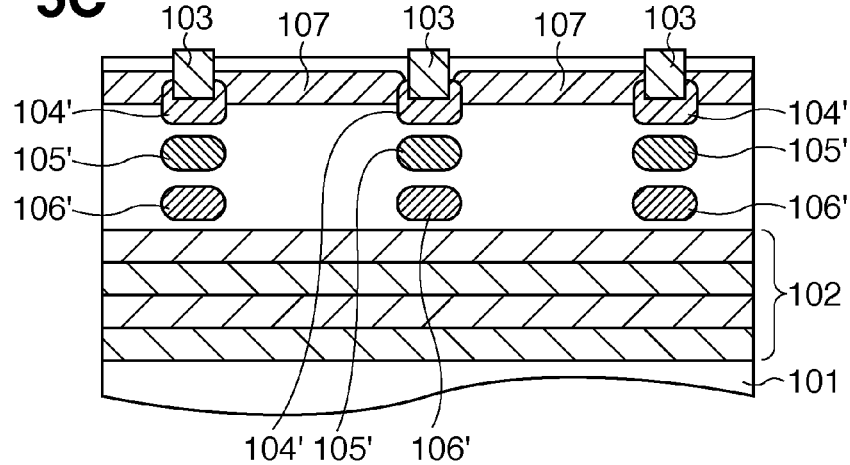

In the step illustrated in FIG. 5C, a resist is applied to the semiconductor substrate SB and then patterned through an exposure process, thereby forming a third resist pattern (not shown) that exposes the regions in which the multiple photoelectric conversion portions are to be disposed. The charge accumulation areas 107 of the photoelectric conversion portions 51 are then formed between the multiple device isolation areas 103 in the semiconductor substrate SB by implanting a P-type first impurity in the semiconductor substrate SB using the third resist pattern as a mask. The P-type first impurity in this step is, for example, boron, which is a P-type impurity. It is preferable for the acceleration energy of the implantation in the step to be approximately 50 to 200 keV.

Figure 6A:
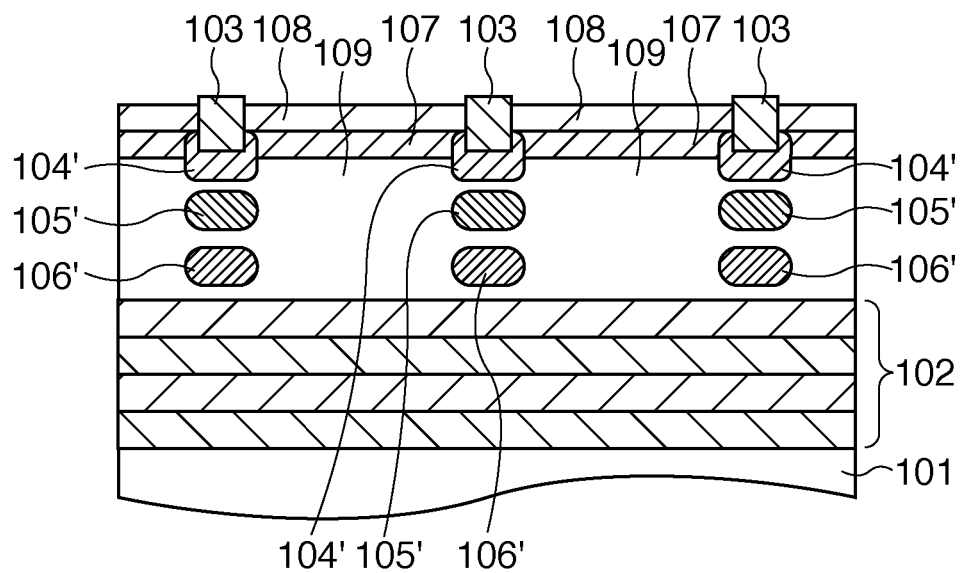
FIGS. 6A and 6B are cross-sections illustrating steps of a photoelectric conversion apparatus manufacturing method according to an embodiment of the present invention.

In the step illustrated in FIG. 6A, the surface regions 108 of the photoelectric conversion portions 51 are then formed between the multiple device isolation areas 103 in the semiconductor substrate SB by implanting a P-type impurity in the semiconductor substrate SB using the third resist pattern as a mask. The P-type impurity in this step is, for example, arsenic, which is a P-type impurity. It is preferable for the acceleration energy of the implantation in the step to be approximately 30 to 120 keV.

Figure 6B:
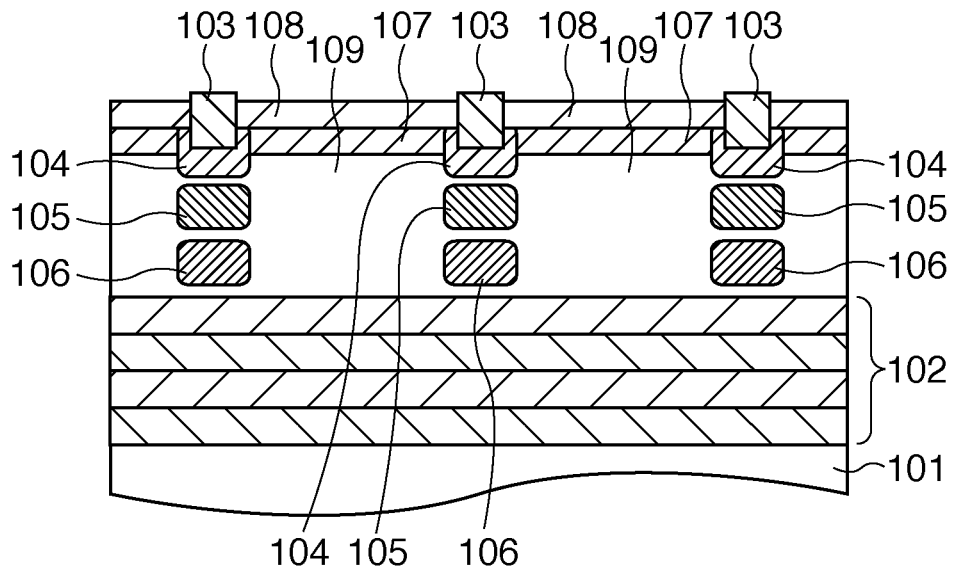

In the step illustrated in FIG. 6B, the semiconductor regions 104 to 106 are stabilized through thermal diffusion (heat treatment). During this thermal diffusion, the arsenic contained in the semiconductor regions 102a to 102d and the semiconductor regions 104' to 106' has a low diffusion coefficient and thus exhibits little diffusion with respect to the profile immediately following implantation.

Figure 7A:
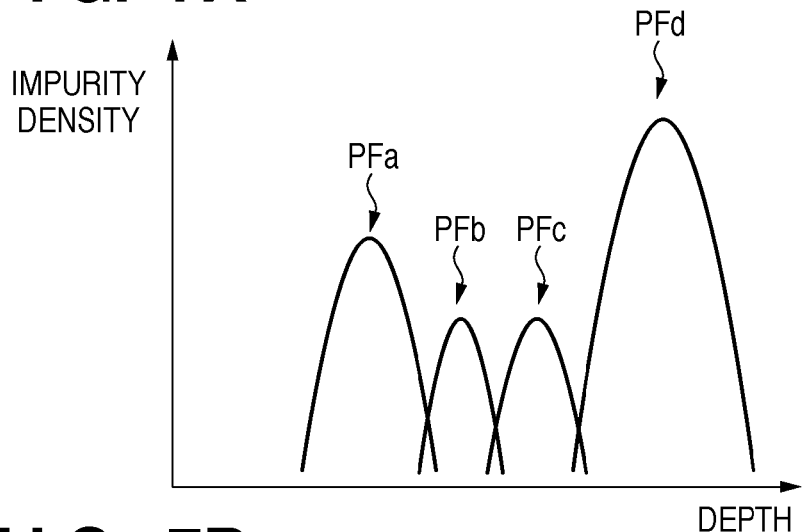
FIGS. 7A through 7C are diagrams illustrating the results of a simulation of the effects of thermal diffusion.
Figure 7B:
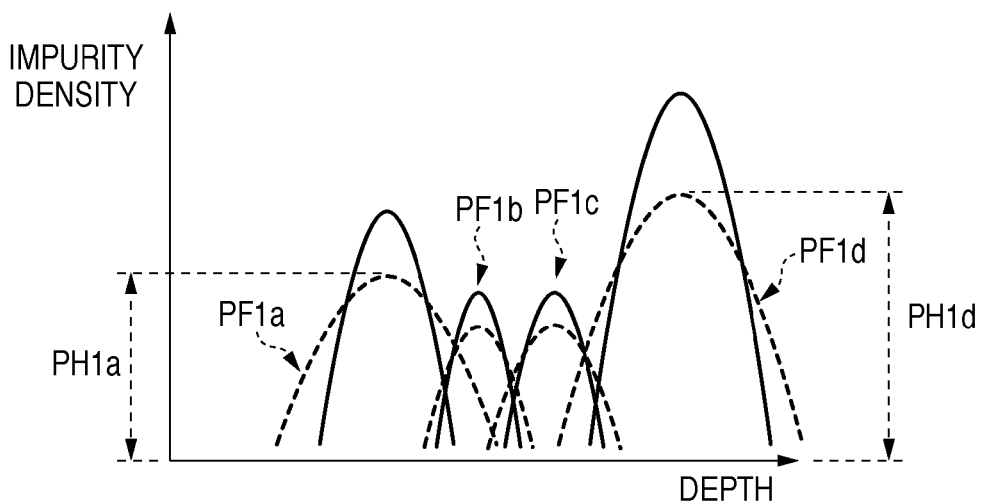
Figure 7C:
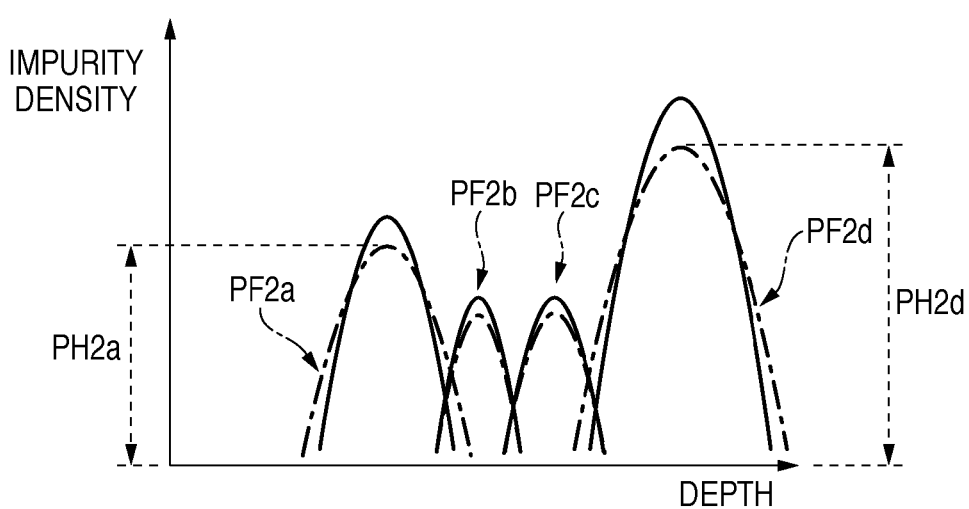

Next, the effects of the present embodiment shall be described using FIGS. 7A to 7C. FIGS. 7A to 7C are diagrams illustrating the results of a simulation of the effects of thermal diffusion.

In FIG. 7A, the solid lines indicate the density profiles PFa to PFd of the arsenic in the semiconductor regions 102a to 102d, respectively, following the completion of the step illustrated in FIG. 4A in the present embodiment, which uses arsenic as the second impurity. These conditions shall be called a "working example".

Here, for comparative purposes, a case in which the conductivity types of the constituent elements in the present embodiment are all reversed and the semiconductor regions 102a to 102d are formed through boron ion implantation shall be considered. In this case as well, it is assumed that the density profiles of the boron in the semiconductor regions 102a to 102d, respectively, are the same as the density profiles PFa to PFd illustrated in FIG. 7A. These conditions shall be called a "comparative example".

Regarding the conditions of the "comparative example", the results of a simulation of the effects of thermal diffusion at 900° C. for approximately one hour following boron ion implantation are expressed by density profiles PF1a to PF1d, indicated by the dotted lines in FIG. 7B. The density profiles PFa to PFd illustrated in FIG. 7A are also shown in FIG. 7B for comparative purposes. As shown in FIG. 7B, when the ion type is boron, the density profiles PF1a and PF1d of the semiconductor regions 102a and 102d, respectively, are broad due to the thermal diffusion. As a result, potential levels PH1a and PH1d of the semiconductor regions 102a and 102d with respect to electrons, which are the carriers of the signal charge in the "comparative example" conditions, are low.

However, regarding the conditions of the "working example", the results of a simulation of the effects of thermal diffusion at 900° C. for approximately 1 hour following arsenic ion implantation are expressed by density profiles PF2a to PF2d, indicated by the dot-dash lines in FIG. 7C. The density profiles PFa to PFd illustrated in FIG. 7A are also shown in FIG. 7C for comparative purposes. As shown in FIG. 7C, when the ion type is arsenic, the density profiles PF2a and PF2d of the semiconductor regions 102a and 102d, respectively, are kept sharp due to the thermal diffusion. As a result, potential levels PH2a and PH2d of the semiconductor regions 102a and 102d with respect to holes, which are the carriers of the signal charge in the "working example" conditions, are kept high. In other words, $$PH2a > PH1a, PH2d > PH1d \qquad \text{Equation 1}$$

Therefore, according to the "working example" conditions, it is more difficult for the signal charge carrier to pass through the multiple semiconductor regions 102a to 102d and reach adjacent photoelectric conversion portions than with the "comparative example" conditions. As a result, the "working example" conditions make it possible to suppress color mixture, which occurs when the distance between adjacent photoelectric conversion portions drops, more than the "comparative example" conditions.

Furthermore, with the "working example" conditions, the diffusion distance from the semiconductor region 102a to the effective sensitivity region 109 in the depth direction is reduced, making it possible to suppress a decrease in the area of the effective sensitivity region 109 more than with the "comparative example" conditions.

Note that the semiconductor region 102d in the well portion 102 may contain a third impurity at the third density. The second impurity uses, for example, arsenic as its primary component. Meanwhile, the third impurity uses, for example, phosphorous as its primary component. The mass of the third impurity is lower than the mass of the second impurity. As a result, it is easy to form the semiconductor region 102d at a deep position in the semiconductor substrate, thereby making it possible to improve the freedom with which the well portion 102 can be designed.

Figure 8A:
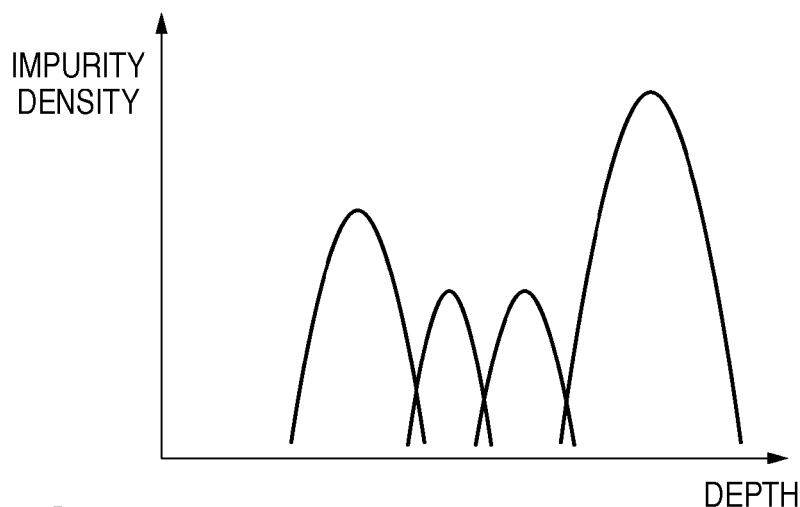
FIGS. 8A through 8C are diagrams illustrating the results of a simulation of the effects of thermal diffusion (a variation).
Figure 8B:
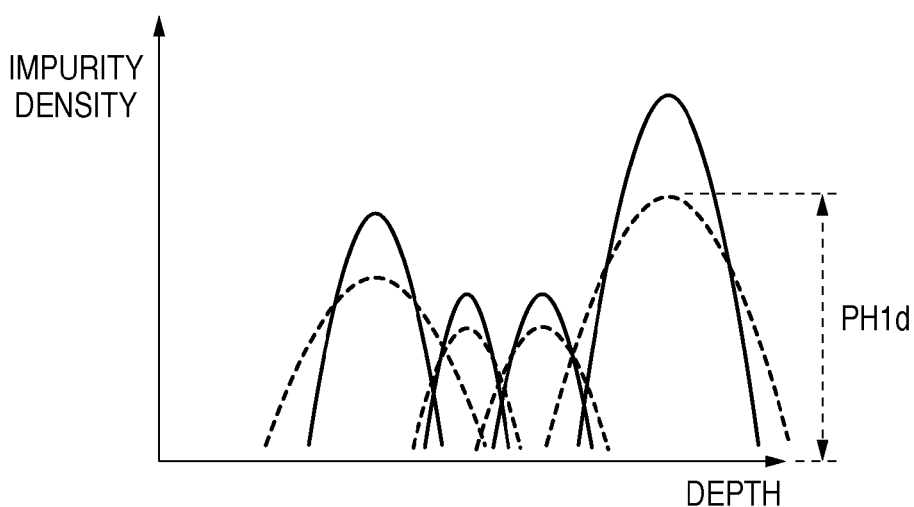
Figure 8C:
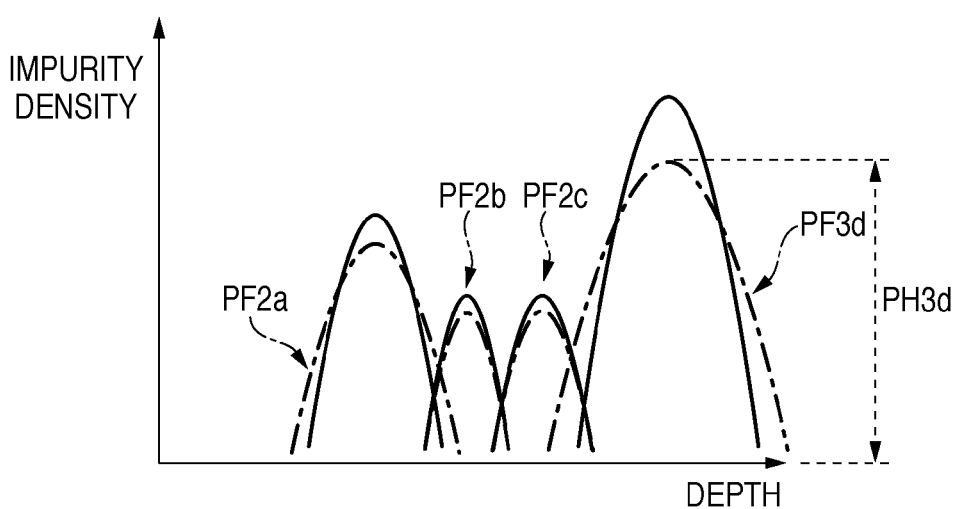

In addition, in this case too, the sharpness of the density profile PF3d of phosphorous in the semiconductor region 102d following thermal diffusion is maintained, as compared to the "comparative example" conditions, as can be seen in FIGS. 8A to 8C. As a result, the potential level PH3d of the semiconductor region 102d with respect to holes, which are the carriers of the signal charge in the "working example" conditions, is kept high. In other words, $$PH3d > PH1d \qquad \text{Equation 2}$$

Thus, according to the "working example" conditions, it is more difficult for the signal charge carrier to pass through the multiple semiconductor regions 102a to 102d and reach adjacent photoelectric conversion portions than with the "comparative example" conditions. As a result, the "working example" conditions make it possible to suppress color mixture, which occurs when the distance between adjacent photoelectric conversion portions drops, more than the "comparative example" conditions.

Figure 9:
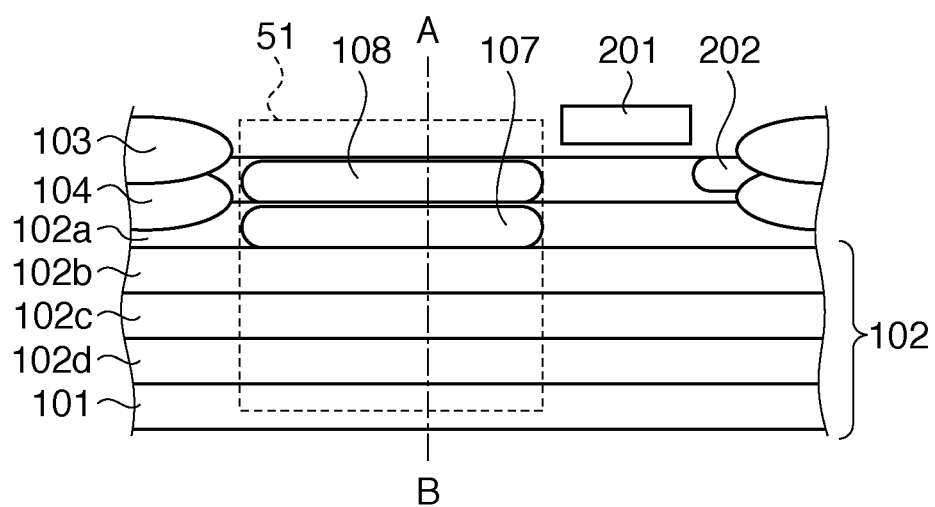
FIG. 9 is a diagram illustrating the cross-sectional structure of a photoelectric conversion apparatus according to a second embodiment of the present invention.

FIG. 9 is a diagram illustrating the cross-sectional structure of a photoelectric conversion apparatus according to another embodiment of the present invention. Constituent elements that have the same functions as those illustrated in FIG. 3 shall be given the same reference numerals, and detailed descriptions thereof shall be omitted.

The cross-section shown in FIG. 9 illustrates a transfer gate electrode 201 disposed above the semiconductor substrate surface SBa with an oxide film (not shown) therebetween. A transfer channel is formed below the transfer gate electrode 201 by a bias applied to the transfer gate electrode 201. 202 is a floating diffusion configured of a P-type semiconductor region. In the present embodiment, the charge accumulating area 107, the transfer gate electrode 201, and the floating diffusion 202 configure a P-type transfer transistor.

The main difference between the present embodiment and the configuration shown in FIG. 3 is as follows: while in FIG. 3 the well portion 102 is disposed in a location deep within the substrate below the effective sensitivity region 109, in the present embodiment, the effective sensitivity region 109 is not provided, and the well portion 102 is provided near to the charge accumulate in area 107.

Figure 10:
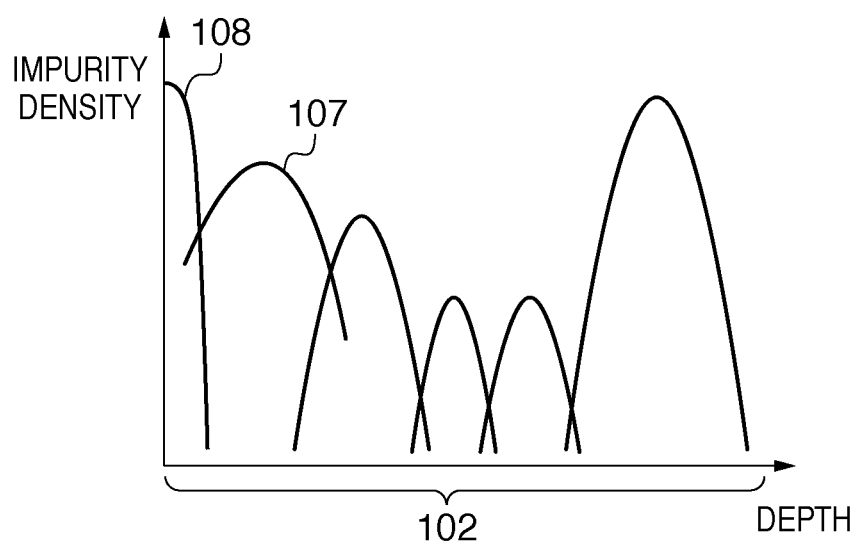
FIG. 10 is a diagram illustrating the results of a simulation of the effects of thermal diffusion according to the second embodiment.

FIG. 10 illustrates an impurity density profile in the depth direction following the A-B line shown in FIG. 9. The well portion 102 contains multiple N-type semiconductor regions of differing depths from the surface SBa of the semiconductor substrate. The semiconductor region 102d disposed in the deepest position has the highest impurity density, whereas the semiconductor region 102a disposed closest to the surface has the next-highest impurity density; the semiconductor regions 102b and 102c have the lowest impurity densities.

The mass of the impurity (for example, arsenic) contained in the semiconductor regions 102a to 102d is greater than the mass of the P-type impurity (for example, boron). Accordingly, even if the well portion is formed by executing heat treatment following impurity implantation, the impurity density peak values in the semiconductor regions 102a to 102d do not easily drop. According to such a configuration, it is possible to maintain the electrical field in the vertical direction from the location deep within the substrate to the surface and efficiently guide the holes produced by the photoelectric conversion portion 51 to the charge accumulating area, thereby making it possible to reduce color mixture between pixels.

The semiconductor region 102a, which is closest to the surface, is disposed immediately below the charge accumulating area 107. A PN junction is configured by the charge accumulating area 107 and the semiconductor region 102a. According to this configuration, the charge accumulating area 107 and the semiconductor region 102a are disposed near one another, thereby making it possible to suppress the expansion of a depleted layer from the charge accumulating area 107. Increasing the impurity density of the semiconductor region 102a closest to the surface makes it possible to suppress the expansion of the depleted layer with ease, particularly in the case where the impurity density of the charge accumulating area 107 has been increased in order to improve the saturation load. Through this, the amplitude of the driving voltage during signal readout can be suppressed even further.

FIG. 11 is a diagram illustrating the cross-sectional structure of a photoelectric conversion apparatus according to another embodiment of the present invention. Constituent elements that have the same functions as those illustrated in FIG. 9 shall be given the same reference numerals, and detailed descriptions thereof shall be omitted.

The main difference between the present embodiment and the configuration shown in FIG. 9 is that N-type semiconductor regions 305 and 306 are disposed below the channel stop region 104. The N-type semiconductor regions 305 and 306 are disposed so as to surround the photoelectric conversion portion 51, and have a higher impurity density than the well portion 102. The N-type semiconductor regions 305 and 306 function as potential barriers for holes, which are the signal charge. Using such a configuration makes it possible to further reduce color mixture between pixels.

In the aforementioned embodiments, the direction in which light enters is not limited. A top-surface incident structure, whereby light enters from the semiconductor substrate surface SBa, can be employed. However, a back-illuminated structure, whereby light enters from the surface opposite to the semiconductor substrate surface SBa, can be employed as well. In a back-illuminated structure, it is necessary to collect the charge in the surface side. As the mobility of holes is lower than that of electrons, it has low diffusion. By applying the present invention to the back-illuminated structure where holes are handled as the signal charge, the lengthwise direction electric field from the deep portion of the substrate toward the surface can be maintained and it is possible to guide the holes to the charge-accumulating region effectively. Therefore, the effect to reduce color mixture between pixels becomes prominent compared with the top-surface incident structure.

Figure 12:
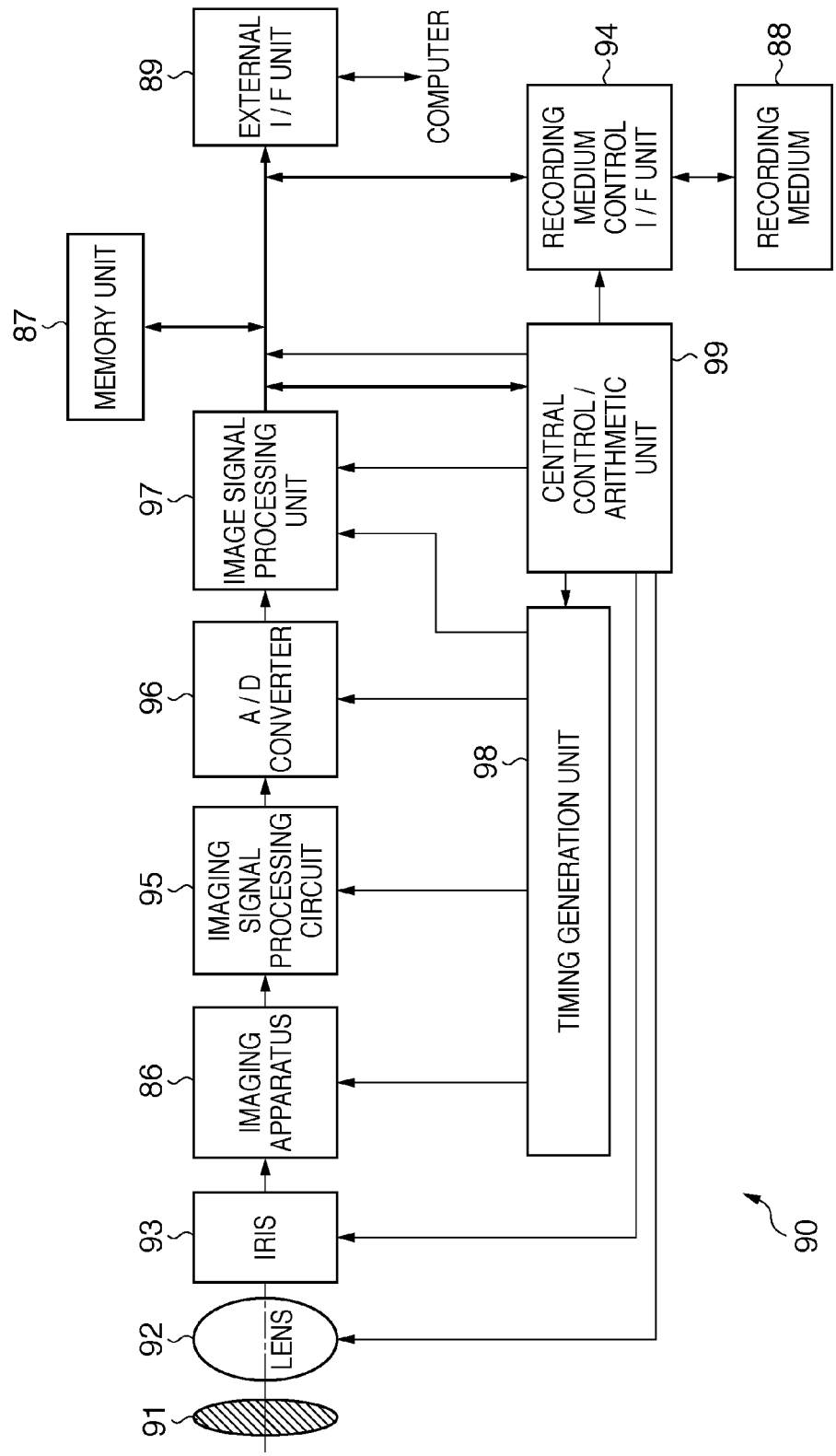
FIG. 12 is a diagram illustrating the configuration of an imaging system in which the photoelectric conversion apparatus according to an embodiment of the present invention has been applied.

Next, FIG. 12 illustrates an example of an imaging system in which the photoelectric conversion apparatus of the present invention has been applied.

As shown in FIG. 12, an imaging system 90 includes, as its primary components, an optical system, an imaging apparatus 86, and a signal processing unit. The optical system includes, as its primary components, a shutter 91, a lens 92, and an iris 93. The imaging apparatus 86 includes the photoelectric conversion apparatus 1. The signal processing unit includes, as its primary components, an imaging signal processing circuit 95, an A/D converter 96, an image signal processing unit 97, a memory unit 87, an external I/F unit 89, a timing generation unit 98, a central control/arithmetic unit 99, a recording medium 88, and a recording medium control I/F unit 94. The signal processing unit does not necessarily need to include the recording medium 88.

The shutter 91 is provided in front of the lens 92 in the optical path, and controls exposures.

The lens 92 refracts incident light, causing an image of a subject to be formed upon an imaging area in the photoelectric conversion apparatus 1 of the imaging apparatus 86.

The iris 93 is provided between the lens 92 and the photoelectric conversion apparatus 1 in the optical path, and adjusts the amount of light introduced into the photoelectric conversion apparatus 1 after passing through the lens 92.

The photoelectric conversion apparatus 1 of the imaging apparatus 86 converts the image of the subject formed upon the imaging area of the photoelectric conversion apparatus 1 into an image signal. The imaging apparatus 86 reads out this image signal from the photoelectric conversion apparatus 1 and outputs the image signal.

The imaging signal processing circuit 95 is connected to the imaging apparatus 86, and processes the image signal outputted from the imaging apparatus 86.

The A/D converter 96 is connected to the imaging signal processing circuit 95, and converts the processed analog image signal outputted from the imaging signal processing circuit 95 into a digital image signal.

The image signal processing unit 97 is connected to the A/D converter 96, and performs various computational processes such as correction on the digital image signal outputted from the A/D converter 96, thereby generating image data. This image data is then supplied to the memory unit 87, the external I/F unit 89, the central control/arithmetic unit 99, the recording medium control I/F unit 94, and so on.

The memory unit 87 is connected to the image signal processing unit 97, and stores the image data outputted from the image signal processing unit 97.

The external I/F unit 89 is connected to the image signal processing unit 97. This makes it possible to transfer the image data outputted from the image signal processing unit 97 to an external device (a personal computer or the like) via the external I/F unit 89.

The timing generation unit 98 is connected to the imaging apparatus 86, the imaging signal processing circuit 95, the A/D converter 96, and the image signal processing unit 97. A timing signal is thus supplied to the imaging apparatus 86, the imaging signal processing circuit 95, the A/D converter 96, and the image signal processing unit 97. The imaging apparatus 86, the imaging signal processing circuit 95, the A/D converter 96, and the image signal processing unit 97 operate in synchronization with the timing signal.

The central control/arithmetic unit 99 is connected to the timing generation unit 98, the image signal processing unit 97, and the recording medium control I/F unit 94, and performs overall control of the timing generation unit 98, the image signal processing unit 97, and the recording medium control I/F unit 94.

The recording medium 88 is connected to the recording medium control I/F unit 94 in a removable state. As a result, image data outputted from the image signal processing unit 97 is recorded into the recording medium 88 via the recording medium control I/F unit 94.

With the configuration described thus far, if a favorable image signal is obtained by the photoelectric conversion apparatus 1, a favorable image (image data) can also be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-026700, filed Feb. 6, 2009, and No. 2010-011375, filed Jan. 21, 2010, which are hereby incorporated by reference herein in their entirety.

The invention claimed is:

1. A photoelectric conversion apparatus comprising:
a plurality of P-type charge accumulating areas disposed in a semiconductor substrate, each of the plurality of P-type charge accumulating areas containing P-type impurities;
an N-type well portion arranged in the semiconductor substrate and under the plurality of P-type charge accumulating areas, extending across the plurality of P-type charge accumulating areas, each of the plurality of P-type charge accumulating areas configuring a photoelectric converter together with the N-type well portion, wherein the well portion includes:
an N-type first semiconductor region extending across the plurality of P-type charge accumulating areas and containing arsenic at a first density,
an N-type second semiconductor region disposed below the first semiconductor region so as to extend across the plurality of P-type charge accumulating areas and containing arsenic at a second density that is lower than the first density, and
an N-type third semiconductor region disposed below the second semiconductor region so as to extend across the plurality of P-type charge accumulating areas and containing N-type impurities at a third density that is higher than the first density;
a device isolation area disposed in the semiconductor substrate; and
a potential barrier disposed between the device isolation area and the N-type first semiconductor region of the well portion so as to isolate the plurality of P-type charge accumulating areas from each other, wherein the potential barrier includes:
an N-type fourth semiconductor region disposed below the device isolation area and containing N-type impurities at a fourth density that is higher than the second density; and
an N-type fifth semiconductor region disposed below the fourth semiconductor region and containing N-type impurities at a fifth density that is higher than the second density.

2. The photoelectric conversion apparatus according to claim 1, wherein the N type impurities of the N-type third semiconductor region are phosphorous.

3. The photoelectric conversion apparatus according to claim 1, wherein each photoelectric conversion portion further includes:
an N-type surface region disposed above the P-type charge accumulating area and containing N type impurities at a sixth density that is higher than the fourth density; and
a P-type charge collecting area disposed below the P-type charge accumulating area and containing N type impurities at a density that is lower than a density of the N-type impurities in the charge accumulating area,
wherein the fourth semiconductor region covers at least a base surface of the device isolation area and extends to the surface region.

4. The photoelectric conversion apparatus according to claim 1, wherein light enters the apparatus so that the light enters in a direction from the first semiconductor region and toward the second semiconductor region.

5. The photoelectric conversion apparatus according to claim 1, wherein light enters the apparatus so that the light enters in a direction from the second semiconductor region and toward the first semiconductor region.

6. The photoelectric conversion apparatus according to claim 1, wherein the photoelectric conversion apparatus is incorporated in an imaging system that includes:

an optical system that forms an image upon an imaging area of the photoelectric conversion apparatus; and
a signal processor that generates image data by processing a signal outputted from the photoelectric conversion apparatus.

* * * * *